United States Patent [19]

Nagahama et al.

[11] 4,297,722
[45] Oct. 27, 1981

[54] CERAMIC PACKAGE FOR SEMICONDUCTOR DEVICES HAVING METALIZED LEAD PATTERNS FORMED LIKE A FLOATING ISLAND

[75] Inventors: Tsutomu Nagahama, Kawasaki; Michio Ishihara, Yokohama, all of Japan

[73] Assignee: Fujitsu Limited, Kawasaki, Japan

[21] Appl. No.: 76,577

[22] Filed: Sep. 18, 1979

[30] Foreign Application Priority Data

Sep. 18, 1978 [JP] Japan ............................. 53-127835[U]

[51] Int. Cl.³ ................... H01L 23/02; H01L 23/12; H01L 39/02
[52] U.S. Cl. ........................................ 357/74; 357/80; 357/81; 174/52 H; 333/247
[58] Field of Search ............... 357/74, 80, 81; 174/52; 333/247

[56] References Cited

U.S. PATENT DOCUMENTS

| | | | |
|---|---|---|---|
| 3,404,214 | 10/1968 | Elliott | 357/74 |
| 3,478,161 | 11/1969 | Carley | 357/80 |
| 3,611,059 | 10/1971 | Carley | 357/80 |
| 3,626,259 | 12/1971 | Garboushian | 357/74 |
| 3,651,434 | 3/1972 | McGeough et al. | 357/74 |
| 3,683,241 | 8/1972 | Duncan | 357/81 |
| 3,748,544 | 7/1973 | Noren | 357/74 |
| 3,801,938 | 4/1974 | Goshgarian | 357/74 |
| 3,898,594 | 8/1975 | Hochbers et al. | 357/80 |

*Primary Examiner*—Andrew J. James
*Attorney, Agent, or Firm*—Staas & Halsey

[57] ABSTRACT

A transistor device which is suitable for a high-frequency and high-power transistor is disclosed. The transistor device comprises a first ceramic plate and a second ceramic plate mounted on the first ceramic plate. The first ceramic plate is provided with a transistor chip element and also emitter, base and collector leads which are formed thereon, each of these leads being connected to a corresponding emitter, base and collector area of the transistor chip element, respectively. The second ceramic plate is provided with emitter, base and collector guide leads formed thereon. These emitter, base and collector guide leads have emitter, base and collector lead terminals, respectively. The emitter, base and collector leads of the first ceramic plate are electrically connected with the corresponding emitter, base and collector guide leads of the second ceramic plate, respectively, by means of respective longitudinal conductive paths formed along and on the side surface of the second ceramic plate.

6 Claims, 7 Drawing Figures

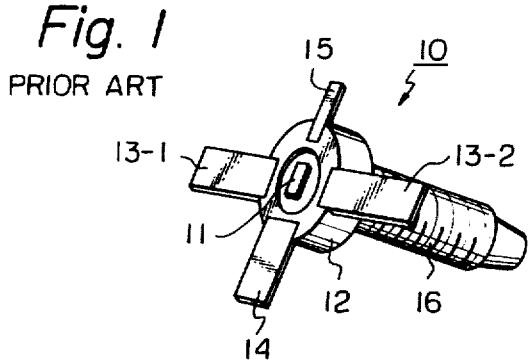
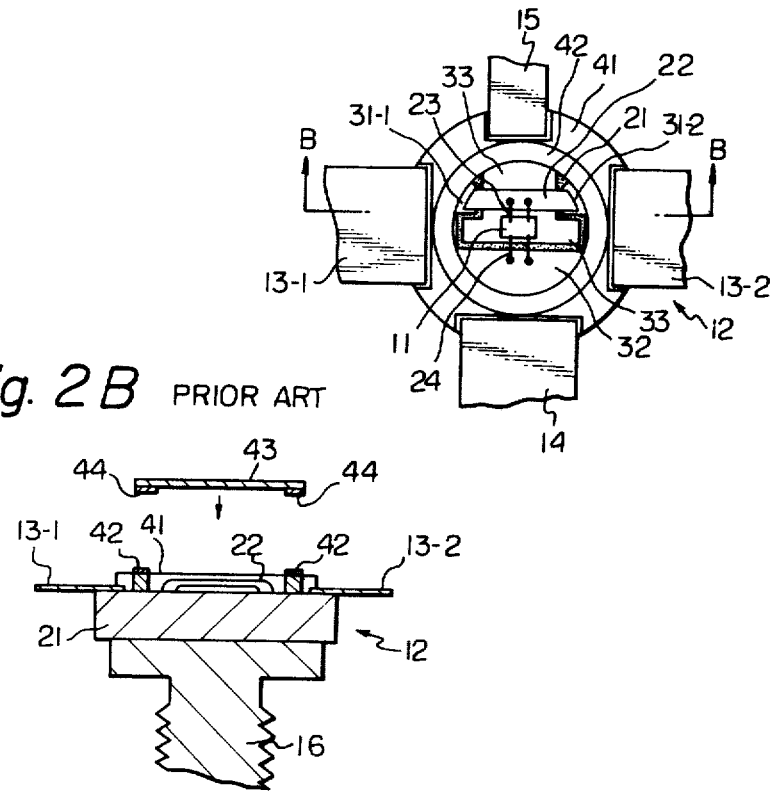

CERAMIC PACKAGE FOR SEMICONDUCTOR DEVICES HAVING METALIZED LEAD PATTERNS FORMED LIKE A FLOATING ISLAND

BACKGROUND OF THE INVENTION

1. Field of the Invention

The present invention relates to a transistor device and, more particularly, to a structure of a transistor assembly which is suitable to fabricate a high-frequency and high-power transistor device.

2. Description of the Prior Art

In the prior art, a high-frequency and high-power transistor device is constructed so as to form a so-called strip line type structure, due to which strip line type structure it is easy to form a large size conductor and to reduce an inductive reactance component so as to satisfy the requirement of the high-frequency and high-power characteristics of a transistor device. In the strip line type transistor device of the prior art, as will be mentioned in detail hereinafter, an emitter bridge is one of the important members thereof. The emitter bridge is very useful for electrically connecting a transistor chip element and both of two separate emitter leads, by way of so-called bonding wires having a very short length. The above mentioned emitter bridge is usually made of an Au-Si alloy and is fixedly bridged between the two separate emitter leads. However, the strip line type transistor device creates a defect. The defect is that it requires very high skill to fabricate the emitter bridge to be connected between the two separate emitter leads, and therefore, firstly the transistor device becomes very high in cost and, secondly it is difficult to make the transistor devices under a mass production method. Further, since the height of the emitter bridge from an emitter area of the transistor chip element is relatively high, an undesirable difference in level between the emitter bridge and the emitter area is created. Accordingly, it is not easy to achieve the so-called wire bonding operation. This fact also causes the mass production of the transistor device to be very difficult.

SUMMARY OF THE INVENTION

Therefore, it is an object of the present invention to provide a transistor device which has an improved structure of a transistor assembly, so as not to create a defect similar to the above mentioned defect of the prior art transistor device.

A transistor device according to the present invention contains no above mentioned emitter bridge; however, in place of the emitter bridge, ceramic plates which are provided with special lead patterns thereon are substituted.

BRIEF DESCRIPTION OF THE DRAWINGS

The present invention will be apparent from the following detailed description of a preferred embodiment of the present invention as illustrated in the accompanying drawings wherein:

FIG. 1 is a perspective view of a usual high-frequency and high-power transistor device to which the present invention is applied;

FIG. 2A is a detailed plan view of the high-frequency and high-power transistor device of the prior art, shown in FIG. 1;

FIG. 2B is a cross sectional view taken along the line B—B shown in FIG. 2A;

DETAILED DESCRIPTION OF A PREFERRED EMBODIMENT

Figure 3:
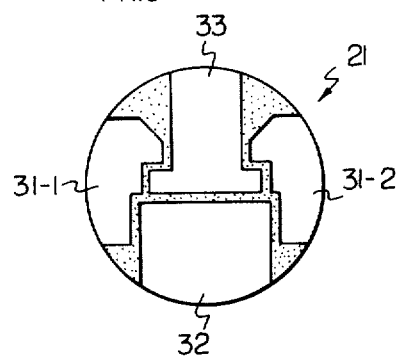
FIG. 3 is a detailed plan view of a ceramic plate 21 shown in both FIGS. 2A and 2B.

In FIG. 1, which is a perspective view of a high-frequency and high-power transistor device to which the present invention is applied, the high-frequency and high-power transistor device 10 is comprised of a transistor chip element 11, a header 12 which fixedly mounts the transistor chip element 11, a first emitter lead terminal 13-1, a second emitter lead terminal 13-2, a base lead terminal 14, a collector lead termical 15, which terminals 13-1, 13-2, 14 and 15 are extruded from the header 12, and a heat sink 16 being provided with a screw thread.

In FIG. 2A, which is a detailed plan view of the transistor 10 shown in FIG. 1, a header 12 is fabricated as the strip line type header of the prior art. FIG. 2B is a cross sectional view taken along the line B—B in FIG. 2A. In FIG. 2B, a ceramic plate 21 is fixed to the top surface of the heat sink 16. The ceramic plate 21 is provided with a lead pattern which is made of a metallized layer formed thereon. A detailed plan view of the lead pattern formed on the ceramic plate 21 is shown in FIG. 3. In FIG. 3, the ceramic plate 21 is provided with a first emitter lead 31-1, a second emitter lead 31-2, a base lead 32 and a collector lead 33. These leads 31-1, 31-2, 32 and 33 form lead patterns on the ceramic plate 21, which lead patterns are made of metallized conductive layers of molybdenum-manganese alloy. The transistor chip element 11 is fixedly mounted on the collector lead 33 such as shown in FIG. 2A. The above mentioned emitter bridge is indicated by the reference numeral 22, which is bridged between the first and second emitter leads 31-1 and 31-2 such as shown in FIGS. 2A and 2B.

In FIGS. 2A and 2B, the emitter area (not shown) of the transistor chip element 11 is electrically connected to the emitter bridge 22 by means of a bonding wire 23 (two bonding wires are shown in FIG. 2A) and is further electrically connected to both the first and second emitter leads 31-1 and 31-2 which are further electrically connected to both the first and second emitter lead terminals 13-1 and 13-2.

Figure 4:
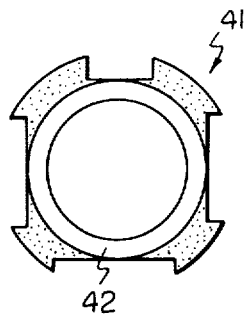
FIG. 4 is a detailed plan view of a ceramic seal plate 41 shown in both FIGS. 2A and 2B.

The base area (not shown) of the transistor chip element 11 is electrically connected to the base lead 32 by means of a bonding wire 24 (two bonding wires are shown in FIG. 2A) which is further electrically connected to the base lead terminal 14. The collector area (not shown) of the transistor chip element 11 is directly and electrically connected to the collector lead 33 which is further electrically connected to the collector lead terminal 15. The reference numeral 41 indicates a ceramic seal plate, the detailed plan view of which ceramic seal plate 41 is shown in FIG. 4. In FIG. 4, a relatively large through-hole is formed in the ceramic seal plate 41 at the center portion thereof. Further, a ring-like metallized layer 42 is formed around the periphery of the through-hole portion. The ceramic seal plate 41 is provided, together with a ceramic cover 43 (not shown in FIG. 2A but shown in FIG. 2B), for sealing the header 12, which plate 41 and cover 43 are fixed together at the respective metallized layers 42 and 44. The metallized layer 44 also has a ring-like shape and is fixedly mounted around the periphery portion of the ceramic cover 43.

Attention should be paid, in FIGS. 2A and 2B, to the emitter bridge 22. The emitter bridge 22 is fixedly connected, at both ends, to the first and second emitter leads 31-1 and 31-2 by using the Au-Si alloy as an adhesive agent. Since the emitter bridge 22 has a usual bridge shape, the emitter bridge 22 can be electrically connected to the emitter area of the transistor chip element 11 without electrically touching the collector lead 33. However, as previously mentioned, a manufacturing process for adhering the emitter bridge 22 with the emitter leads 31-1, 31-2, requires high skill and many fabricating steps. Accordingly, it is difficult to make the transistor device under a mass production method, and each transistor device becomes very high in cost. Further, since the height of the emitter bridge 22 becomes 300 through 350 μm, a relatively high undesirable difference in level is created between the emitter area of the transistor chip element 11 and the emitter bridge 22. Thus, the process for bridging the bonding wire 23 requires high skill, and accordingly, this process is not suitable to mass production, which fact also leads to high cost of such a transistor device.

Figure 5A:
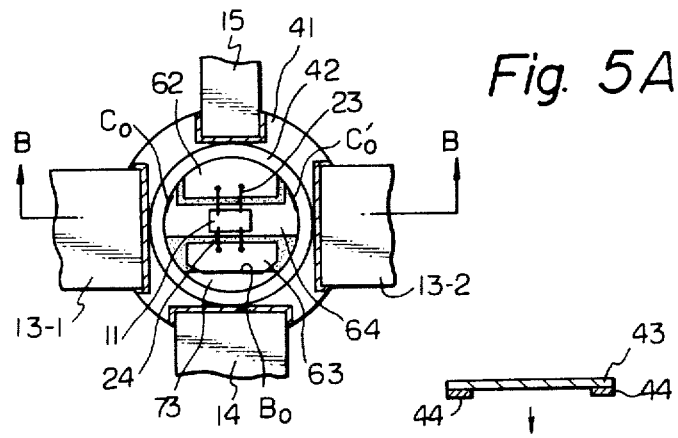
FIG. 5A is a detailed plan view of a high-frequency and high-power transistor device, according to the present invention, shown in FIG. 1.
Figure 5B:
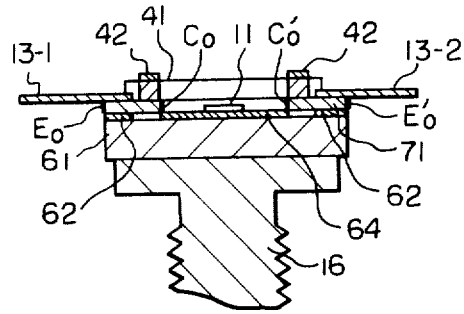
FIG. 5B is a cross sectional view taken along the line B—B shown in FIG. 5A.
Figure 6:
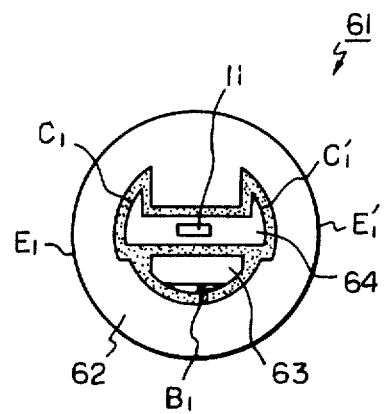
FIG. 6 is a detailed plan view of a first ceramic plate shown in FIGS. 5A and 5B.

Now a transistor device of the present invention will be explained. A detailed plan view of the transistor device according to the present invention is shown in FIG. 5A. FIG. 5B is a cross sectional view taken along the line B—B shown in FIG. 5A. In FIGS. 5A and 5B, the members which are indicated by the same reference characters as those shown in preceding figures are identical with each other. As is apparent from FIGS. 5A and 5B, no emitter bridge of the prior art is employed in the transistor device. A first ceramic plate 61 is fixed to the top surface of the heat sink 16 (see FIG. 5B). A detailed plan view of the first ceramic plate 61 is shown in FIG. 6. In FIG. 6, the first ceramic plate 61 is provided with an emitter lead 62, a base lead 63 and a collector lead 64, thereon. The base lead 63 has a lead pattern formed like a floating island. The collector lead 64 also has a lead pattern formed like a floating island and transistor chip element 11 is mounted thereon. The emitter lead 62 has a ring-like pattern which surrounds the floating islands, that is the base and collector leads 63 and 64. These leads 62, 63 and 64 are made of metallized conductive layers of, for example, a molybdenum-manganese alloy adhered on the top surface of the first ceramic plate 61. The bottom of the first ceramic plate 61 has a smoothed flat surface. A metallized layer is formed entirely on this smoothed flat surface, which metallized layer is used for the adhesion with the top surface of the heat sink 16 (FIG. 5B). The above mentioned leads 62, 63 and 64 are also partially shown in FIG. 5A.

Figure 7A:
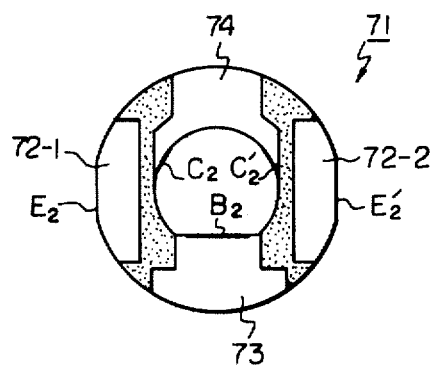
FIG. 7A is a detailed plan view of a second ceramic plate 71 shown in FIGS. 5A and 5B.
Figure 7B:
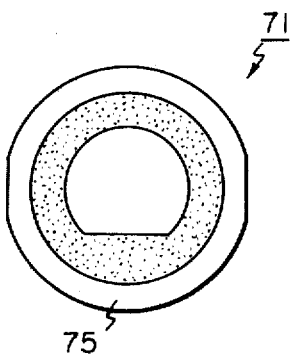
FIG. 7B is a bottom view of the second ceramic plate 71 shown in FIGS. 5A and 5B.

A second ceramic plate 71 is fixed to the first ceramic plate 61, which second ceramic plate is the most distinctive member when compared to the members which comprise the header 12 (see FIGS. 2A and 2B) of the prior art. A detailed plan view of the second ceramic plate 71 is shown in FIG. 7A, and a detailed bottom view thereof is shown in FIG. 7B. In FIG. 7A, a through-hole having a shape of a partial circle, is formed in the second ceramic plate 71 at the center portion thereof. Mounted on plate 71, which is provided with said through hole, is a first emitter guide lead 72-1, a second emitter guide lead 72-2, a base guide lead 73 and a collector guide lead 74. The base guide lead 73 partially occupies an edge which forms one part of the through hole. The collector guide lead 74 partially occupies an edge which forms the other part of the through hole. These guide leads 72-1, 72-2, 73 and 74 are made of metallized layers of, for example, a molybdenum-manganese alloy.

In FIG. 7B, the bottom of the second ceramic plate 71 has a smoothed flat surface, on which surface a ring-like metallized layer 75 is formed.

The bottom surface of the second ceramic plate 71 (see FIG. 7B) is overlapped on the top surface of the first ceramic plate 61 (see FIG. 6), and both bottom and top surfaces are fixedly connected with each other, at respective metallized layers 75 and 62, which metallized layers act as adhesive agents. It is very important to understand that the emitter, base and collector leads 62, 63 and 64 of the first ceramic plate 61 are electrically connected, respectively with the emitter, base and collector guide leads (72-1, 72-2), 73 and 74 of the second ceramic plate 71, by means of respective longitudinal conductive paths which are formed along and on the thin side surfaces (walls) of the second ceramic plate 71. The above mentioned longitudinal conductive paths are represented, in FIG. 7A, by the reference symbols $E_2$, $E_2'$, $B_2$, $C_2$ and $C_2'$. The conductive paths $E_2$ and $E_2'$ of the first and second emitter guide leads 72-1 and 72-2, extend to terminations $E_1$ and $E_1'$ (see FIG. 6) of the emitter lead 62 in the first ceramic plate 61, respectively. The conductive path $B_2$ of the base guide lead 73 extends to a termination $B_1$ (see FIG. 6) of the corresponding base lead 63 in the plate 61. The conductive paths $C_2$ and $C_2'$ of the collector guide lead 74, extend to terminations $C_1$ and $C_1'$ (see FIG. 6) of the corresponding collector lead 64 in the plate 61, respectively. Each pair of the conductive paths ($E_2$, $E_2'$, $B_2$, $C_2$, $C_2'$) and the corresponding terminations ($E_1$, $E_1'$, $B_1$, $C_1$, $C_1'$), can be formed by utilizing, for example, a conventional silver solder process. Thus, emitter parts, base parts and emitter parts of the respective first and second ceramic plates 61 and 71, respectively are electrically connected with each other by way of the outer thin side surface and inner thin side surface of the second ceramic plate 71. The pairs of the conductive paths ($E_2$, $E_2'$) and the corresponding terminations ($E_1$, $E_1'$) are represented by the reference symbols ($E_0$, $E_0'$), respectively in FIG. 5B. The conductive path $B_2$ and the corresponding termination $B_1$, is represented by the reference symbol $B_0$ in FIG. 5A. The pairs of the conductive paths ($C_2$, $C_2'$) and the corresponding terminations ($C_1$, $C_1'$) are represented by the reference symbols ($C_0$, $C_0'$), respectively in both FIGS. 5A and 5B. Thus, in FIGS. 5A and 5B, the emitter area of the transistor chip element 11 is electrically connected to the first and second emitter lead terminals 13-1 and 13-2 by way of the sequency of the bonding wires 23, the emitter lead 62, and the pairs of the conductive paths and the terminations $E_0$ and $E_0'$ and the emitter guide leads 72-1 and 72-2, without employing the aforesaid undesirable emitter bridge of the prior art. Similarly, the base area of the transistor chip element 11 is electrically connected to the base lead terminal 14, by way of the sequence of the bonding wires 24, the base lead 63, the conductive path and the termination $B_0$ and the base guide lead 73. The collector area of the transistor chip element 11 is electrically connected to the collector lead terminal 15, by way of the sequence of the collector lead 64, the conductive paths and the terminations $C_0$ and $C_0'$ and the collector guide lead 74. Finally, all the metalic parts of the transistor device are plated by gold, and the ceramic cover 43 (FIG. 5B) is attached to the ceramic seal plate 41, at respective metallized layers 44 and 42 which act as adhesive agents for sealing the header.

As described above, the emitter bridge of the prior art is substituted for a simple ceramic plate, that is the plate 71, being provided with lead patterns formed thereon, according to the present invention. Therefore, the process for building up the emitter bridge is eliminated from the processes for fabricating the transistor device, which former process requires high skill. Further, since there is almost no difference in level between the top surface of the transistor chip element and the top surfaces of both the emitter and base leads, it is easy to achieve the wire bonding formations. Accordingly, the transistor device of the present invention is suitable for mass production. As a result, a high-frequency and high-power transistor device, which is cheap in cost, can be produced.

What is claimed is:

1. A transistor device comprising:
   a first ceramic plate which is provided with an emitter lead, a base lead and a collector lead, these emitter, base and collector leads being formed as metallized layers on the plate and being electrically connected to the corresponding base, emitter and collector areas of a transistor chip element which is also mounted on the first ceramic plate; and
   a second ceramic plate which is provided with an emitter guide lead, a base guide lead and a collector guide lead, these emitter, base and collector guide leads being formed as metallized layers on the plate and having corresponding emitter, base and collector lead terminals, respectively, wherein the emitter, base and collector leads of the first ceramic plate are electrically connected to the corresponding emitter, base and collector guide leads of the second ceramic plate, respectively, by means of respective conductive paths formed longitudinally along and on the side surface of the second ceramic plate.

2. A device as set forth in claim 1, wherein the first ceramic plate is provided with said base lead having a lead pattern formed like a floating island, the collector lead having a lead pattern formed like a floating island and on which the transistor chip element is mounted, and the emitter lead having a ring-like lead pattern surrounding both the base and collector leads, said second ceramic plate having a through-hole therein and being directly fixed, at its bottom, to the top of the first ceramic plate, the emitter and base areas of said chip being connected respectively to said emitter and base leads of said first ceramic plate by respective bonding wires, both the transistor chip element and bonding wires being located in said through-hole.

3. A device as set forth in claim 2, wherein the conductive paths for electrically connecting the base and collector leads with the base and collector guide leads, respectively, are formed along and on the wall of the through-hole, and each said conductive path for connecting the emitter lead and each emitter guide lead are formed along and on the outer side surface of the second ceramic plate.

4. A device as set forth in claim 3, comprising first and second emitter guide leads respectively provided with first and second conductive paths and also first and second emitter lead terminals.

5. A device as set forth in claim 1, 2, 3, or 4, wherein the emitter, base and collector leads are formed as metallized layers mounted on the first ceramic plate, and the emitter, base and collector guide leads are formed as metallized layers mounted on the second ceramic plate.

6. A device as set forth in claim 1, 2, 3 or 4, wherein the second ceramic plate is provided with a sealing means at its top, and the first ceramic plate is provided with a heat sink means at its bottom.

* * * * *